United States Patent
Tang (10) Patent No.: US 7,612,626 B2
(45) Date of Patent: Nov. 3, 2009

(54) PROGRAMMABLE VARACTOR FOR VCO GAIN COMPENSATION AND PHASE NOISE REDUCTION

(75) Inventor: Yiwu Tang, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 36 days.

(21) Appl. No.: 11/835,499

(22) Filed: Aug. 8, 2007

(65) Prior Publication Data

US 2008/0136544 A1    Jun. 12, 2008

Related U.S. Application Data

(60) Provisional application No. 60/869,682, filed on Dec. 12, 2006.

(51) Int. Cl.
  *H03B 5/12* (2006.01)
(52) U.S. Cl. .............. 331/179; 331/117 FE; 331/177 V
(58) Field of Classification Search ................ 331/1 A, 331/16, 36 C, 117 R, 117 FE, 117 D, 167, 331/168, 175, 177 R, 177 V, 179
  See application file for complete search history.

(56) References Cited

U.S. PATENT DOCUMENTS

| 5,739,730 | A | * | 4/1998 | Rotzoll | ............... | 331/177 V |
|---|---|---|---|---|---|---|
| 6,211,745 | B1 | * | 4/2001 | Mucke et al. | ........... | 331/117 R |
| 6,445,257 | B1 | * | 9/2002 | Cox et al. | ............... | 331/117 R |
| 6,825,785 | B1 | | 11/2004 | Huang et al. | | |
| 2005/0184812 | A1 | | 8/2005 | Cho | | |
| 2005/0258906 | A1 | | 11/2005 | Su et al. | | |
| 2006/0208806 | A1 | | 9/2006 | Chien | | |
| 2006/0267693 | A1 | | 11/2006 | Buell | | |

OTHER PUBLICATIONS

Broussev et al., "A Wideband Low Phase-Noise LC-VCO With Programmable KVCO", IEEE, Microwave and Wireless Components Letters, Apr. 2007, vol. 17, Issue 4, pp. 274-276.
Hauspie et al., "Wideband VCO with Simultaneous Switching of Frequency Band, Active Core and Varactor Size", IEEE, Solid-State Circuits Conference, 2006. ESSCIRC 2006. Proceedings of the 32nd European, pp. 452-455.
International Search Report—PCT/US07/087320, International Search Authority—European Patent Office—Apr. 28, 2008.
Written Opinion—PCT/US07/087320, International Search Authority—European Patent Office—Apr. 28, 2008.

* cited by examiner

*Primary Examiner*—David Mis
(74) *Attorney, Agent, or Firm*—Charles D. Brown; William M Hooks (57) ABSTRACT

A programmable varactor apparatus may include multiple binary weighted varactors controlled by multiple digital varactor bits. A programmable varactor apparatus may include a plurality of binary weighted varactors, and a control to selectively disable one or more of the plurality of binary weighted varactors to decrease an effective capacitance of the programmable varactor apparatus. A method for changing an effective capacitance of a programmable varactor apparatus may include providing a plurality of binary weighted varactors, and disabling one or more of the plurality of binary weighted varactors to decrease the effective capacitance of the programmable varactor apparatus.

25 Claims, 12 Drawing Sheets

$K_v$ in 'low $K_v'$' case is half of that in 'high $K_v'$'.
In both cases, $K_v$ $I_{CP}$ product is the same.

FIG. 10

PROGRAMMABLE VARACTOR FOR VCO GAIN COMPENSATION AND PHASE NOISE REDUCTION

RELATED APPLICATION

This application claims priority to U.S. Provisional Application No. 60/869,682, filed Dec. 12, 2006 entitled PROGRAMMABLE VARACTOR FOR VCO GAIN COMPENSATION AND PHASE NOISE REDUCTION.

BACKGROUND

The present invention generally relates to voltage controlled oscillators (VCOs). More particularly, this invention relates to programmable varactors for VCOs.

An electronic oscillator may be an electronic circuit that produces an electric signal. A voltage controlled oscillator (VCO) may be an electronic oscillator. A VCO may be used, for example, in a radio transceiver such as a mobile telephone.

The frequency of a VCO output signal may be controlled by an input tuning voltage of the VCO. The frequency may be tuned by a variable capacitor having a particular capacitance. As shown, the particular capacitance may be a function of the input tuning voltage $$f(C) = \frac{1}{2\pi\sqrt{LC}}, \quad C = C_0 + C_{CT} + C_{VAR}(V),$$

$$K_V = \left|\frac{df}{dV}\right| = \left|\frac{df}{dC}\frac{dC}{dV}\right| = 2\pi^2 L f^3 \left|\frac{dC}{dV}\right| \propto 2\pi^2 L N^3 \left|\frac{dC}{dV}\right|$$

where L is the VCO tank circuit inductance, C is the total tank circuit capacitance, $C_0$ is the parasitic tank capacitance, $C_{CT}$ is the coarse tune bank capacitance, $C_{VAR}$ is the varactor capacitance, N is the phase locked loop (PLL) counter value (divide ratio), V is the varactor control voltage, and $K_V$ is the magnitude of VCO gain. When the PLL is clocked, the VCO oscillation frequency equals the target frequency, i.e., $f=N*f_{ref}$, where $f_{ref}$ is the PLL reference frequency.

The VCO gain $K_V$ is proportional to $f^3$ as shown above. Due to the width of the frequency tuning range (i.e., the large range of f and N), VCO gain variation is very large over the VCO frequency range, with a ratio of 2:1 to 8:1 from the high end to the low end of the frequency range depending on the actual frequency plan.

There are disadvantages associated with large VCO gain variation. PLL bandwidth varies with VCO gain, causing spur and integrated phase noise problems. PLL dynamics also vary, causing a settling time problem. Phase noise is worse at higher frequency according to Leeson's equation and worse with higher VCO gain due to amplitude modulation to phase modulation (AM-PM) conversion. As shown above, VCO gain is larger at higher frequency, which makes phase noise even worse.

Traditionally, VCO gain compensation is accomplished by adjusting a charge pump current, i.e., decreasing charge pump current $I_{CP}$ when VCO gain is high, and vice versa. Although the loop transfer function H(S) remains the same if the product of VCO gain and $I_{CP}$ is constant, the noise from the loop filter resistor R has a different transfer function for a different VCO gain:

$$L_R(s) = 4KTR \frac{C_Z}{C_Z + C_P} \frac{1}{1 + sRC_ZC_P/(C_Z + C_P)} \left|\frac{K_V/s}{1 + H(s)}\right|^2$$

where $C_Z$ and $C_P$ are the zero and pole loop capacitors, respectively, R is the PLL loop filter resistor, K is the Boltzmann constant 1.38e-23 Joule/Kelvin, and T is temperature in Kelvin. A higher $K_V$ results in more noise contribution from the loop filter resistor.

As can be seen, there is a need for improved VCO gain compensation. In particular, it is desirable to maintain a relatively constant VCO gain other than by adjusting a charge pump current.

SUMMARY

An embodiment includes a programmable varactor apparatus, including a plurality of binary weighted varactors; and a control to selectively disable one or more of the plurality of binary weighted varactors to decrease an effective capacitance of the programmable varactor apparatus.

Another embodiment includes a programmable varactor apparatus, including a plurality of binary weighted varactors; a plurality of bits to control the plurality of binary weighted varactors by selectively disabling one or more of the plurality of binary weighted varactors to decrease an effective capacitance of the programmable varactor apparatus.

Another embodiment includes a voltage controlled oscillator, including a signal output to output a signal at a frequency; an input tuning voltage to affect the frequency of the signal;, a gain; and a programmable varactor apparatus. The programmable varactor apparatus includes a plurality of binary weighted varactors; and a plurality of control lines, each corresponding to one of the plurality of binary weighted varactors, to selectively disable one or more of the plurality of the binary weighted varactors to maintain a substantially constant value of the gain regardless of a value of the frequency, wherein one or more of the plurality of control lines selectively disables one or more of the plurality of binary weighted varactors based on a counter value proportional to the frequency.

Yet another embodiment includes a programmable varactor apparatus, including a fixed enabled varactor; a plurality of binary weighted varactors; a plurality of control lines, each corresponding to one of the plurality of binary weighted varactors, to selectively disable one or more of the plurality of the binary weighted varactors to decrease an effective capacitance of the programmable varactor apparatus; and varactor bits to control the plurality of control lines based on a counter value proportional to a target oscillator frequency.

Still another embodiment includes a programmable varactor apparatus, including a means for providing a plurality of varactors; and a means for controlling the multiple varactors to change an effective capacitance of the programmable varactor apparatus.

A further embodiment includes a method for changing an effective capacitance of a programmable varactor apparatus, the method including providing a plurality of binary weighted varactors; and disabling one or more of the plurality of binary weighted varactors to decrease the effective capacitance of the programmable varactor apparatus.

Yet a further embodiment includes a method for changing an effective capacitance of a programmable varactor apparatus, the method including a step for providing a plurality of binary weighted varactors; and a step for disabling one or more of the plurality of binary weighted varactors to decrease the effective capacitance of the programmable varactor apparatus.

These embodiments will become better understood with reference to the following drawings, description and claims.

DETAILED DESCRIPTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, embodiments of the present invention may include multiple varactors selectively disabled such that a VCO gain measure of a VCO remains substantially constant. Embodiments may be useful in a variety of applications utilizing VCOs, including radio transceivers such as mobile telephones.

Embodiments of the present invention may differ from conventional VCOs at least by digitizing a varactor into multiple binary weighted varactors. Embodiments of the present invention may also differ from conventional VCOs at least by providing bits to control the multiple binary weighted varactors. Embodiments of the present invention may additionally differ from conventional VCOs at least by providing a VCO with a varactor of varying capacitance. Embodiments of the present invention may further differ from conventional VCOs at least by controlling the multiple binary weighted varactors based on a counter value proportional to a VCO frequency.

Figure 1:
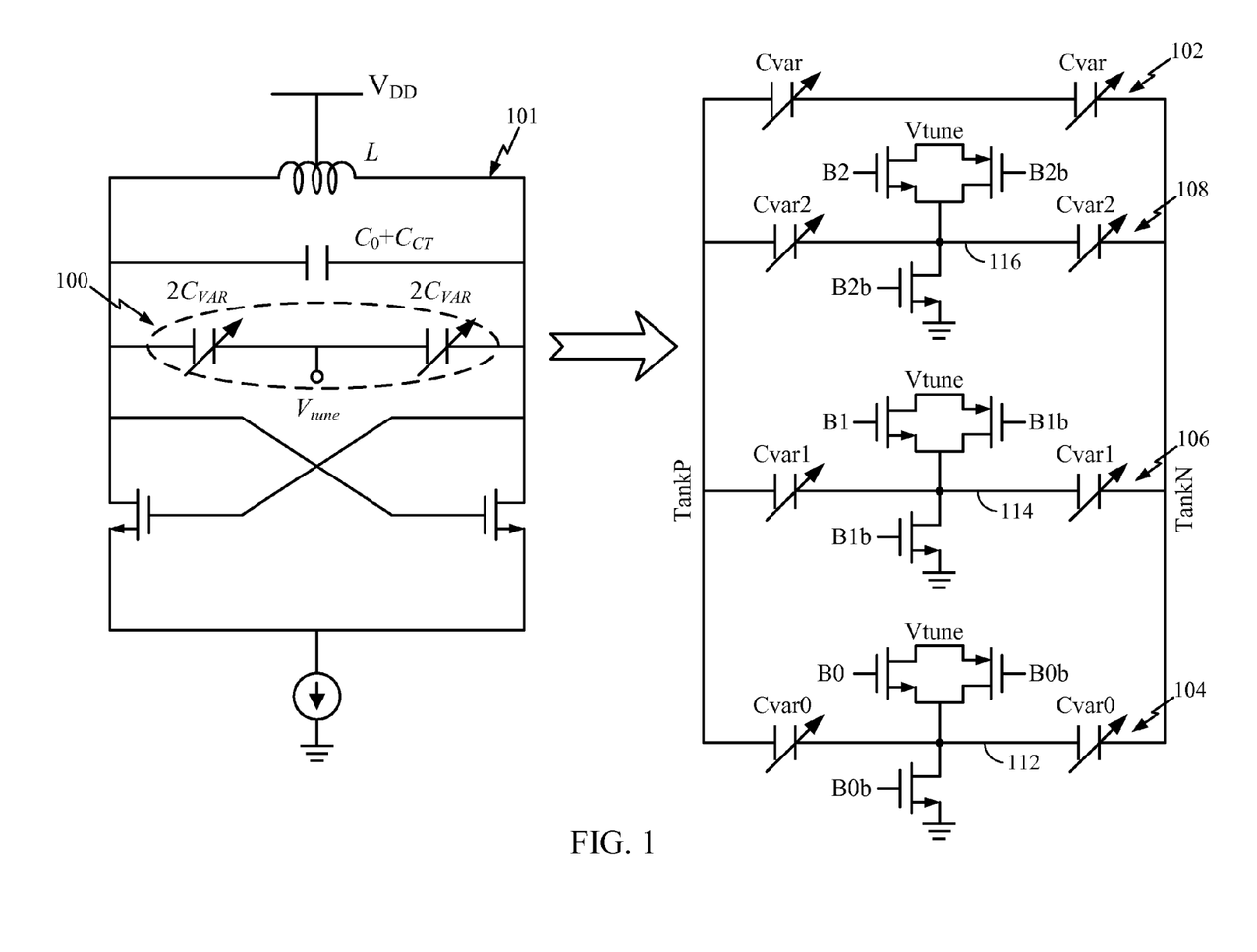
FIG. 1 is a schematic representation of a programmable varactor apparatus of a voltage controlled oscillator (VCO) according to an embodiment of the present invention.

Referring now to the drawings, similar reference characters designate corresponding parts throughout the drawings. FIG. 1 is a schematic representation of a programmable varactor apparatus 100 of a voltage controlled oscillator (VCO) according to an exemplary embodiment of the present invention. The sensitivity of the programmable varactor apparatus 100 may be adjusted as described below based on the VCO frequency such that VCO gain remains substantially constant (see, for example, FIG. 4 where the VCO gain remains more constant relative to the case without VCO gain compensation).

The programmable varactor apparatus 100 may include multiple binary weighted varactors controlled by multiple digital varactor bits. In an embodiment, the programmable varactor apparatus 100 may include a fixed varactor 102 that may remain enabled, and three additional branches of binary weighted varactors 104, 106, 108 controlled by three bits. However, in an alternative embodiment, a programmable varactor apparatus may include a different number of additional branches of binary weighted varactors and an additional number of bits. For example, a programmable varactor apparatus may include two, four, or any other appropriate number of additional branches of binary weighted varactors, and bits.

In an embodiment, the programmable varactor apparatus 100 may be connected to a tank circuit 101 through a DC coupling. Thus, the programmable varactor apparatus 100 may be directly connected to the tank circuit.

The programmable varactor apparatus 100 may include control lines 112, 114, 116. The control lines 112, 114, 116 may, with the three bits as discussed below, control whether one (or more) of the binary weighted varactors 104, 106, 108 is enabled or disabled. If one of the binary weighted varactors 104, 106, 108 is to be enabled, its control line 112, 114, 116 may be connected to Vtune (VCO tuning voltage generated from PLL). If one of the binary weighted varactors 104, 106, 108 is to be disabled, its control line 112, 114, 116 may be connected to ground, resulting in zero $dC_{VAR}/dV$ for that particular branch.

At the low end of the frequency (as a non-limiting example, 3.2 GHz) where VCO gain may be the smallest, all of the varactors may be enabled. That is, the fixed varactor 102, and all three additional branches of binary weighted varactors 104, 106, 108 may be enabled. As frequency increases (i.e., N increases) towards the high end of the frequency (as a non-limiting example, 4.4 GHz), some of the binary weighted varactors may be disabled such that the effective varactor capacitance (dC/dV) gradually decreases. That is, one or more of the binary weighted varactors 104, 106, 108 may be disabled, one-by-one, such that the effective varactor capacitance gradually decreases. Thus, VCO gain may remain substantially constant. For example, VCO gain variation may be less than ±10%.

The effective varactor capacitance of the programmable varactor apparatus 100 may be controlled based on the three bits. The fixed varactor (Cvar) 102 may always be enabled. The three additional branches of binary weighted varactors 104, 106, 108 may be controlled by the three bits. B0, B1, and B2 may represent three binary control bits. B2 may be the most significant bit. B0 may represent the least significant bit. B0b, B1b, and B2b may be complementary of B0, B1, and B2. The capacitance value of the least significant bit (000) may be Cvar0. For 001, the capacitance value may be Cvar+Cvar0. For 010, the value may be Cvar+2*Cvar0. For 011, the value may be Cvar+3*Cvar0. For 100, the value may be Cvar+4*Cvar0. For 101, the value may be Cvar+5*Cvar0. For 110, the value may be Cvar+6*Cvar0. For 111, the value may be Cvar+7*Cvar0. Cvar2 may equal 2*Cvar1 which may equal 4*Cvar0. The three bits may be derived from the PLL N counter value (e.g., divide ratio), which may be proportional to the VCO frequency.

Figure 2:
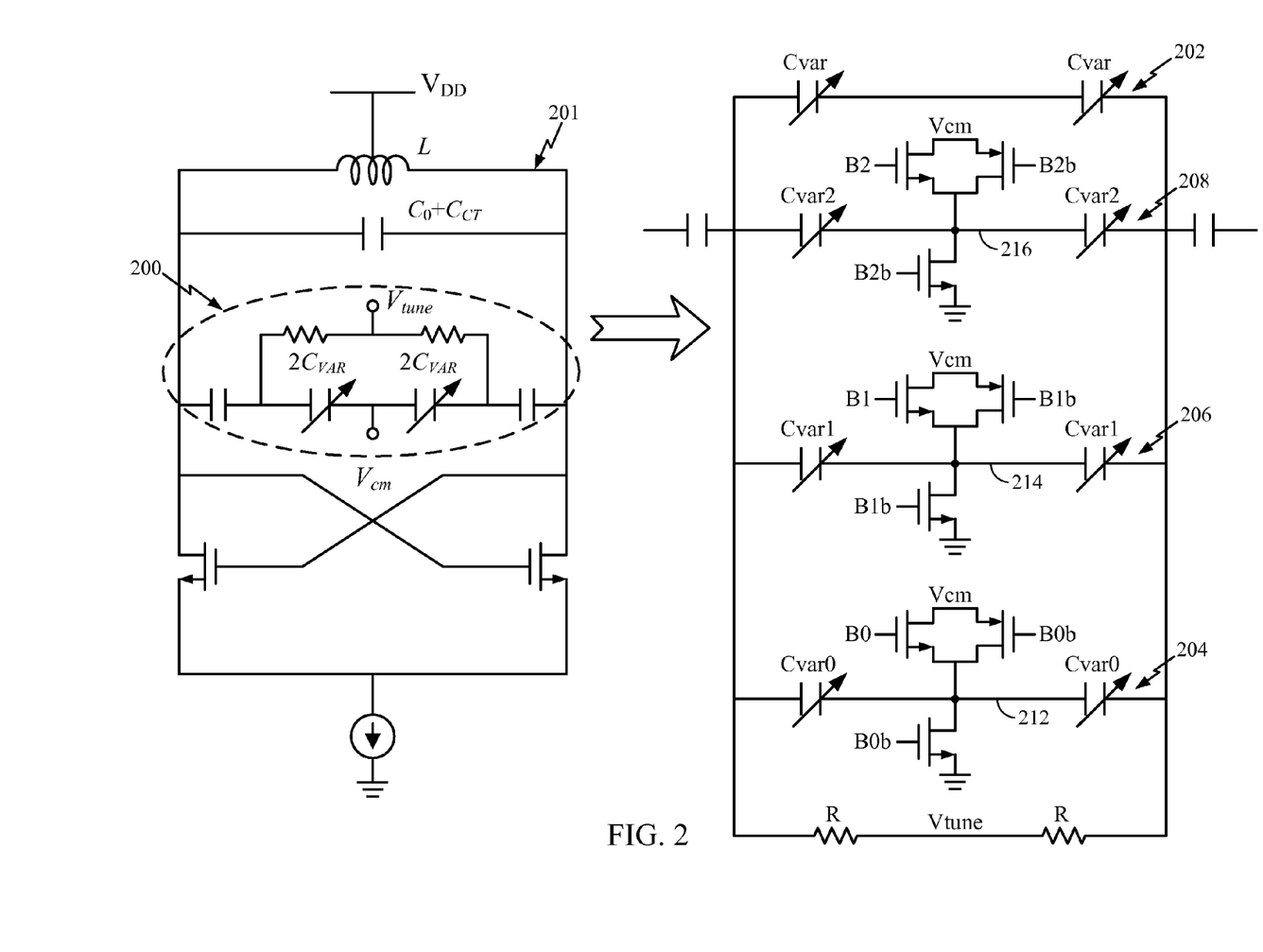
FIG. 2 is a schematic representation of a programmable varactor apparatus of a VCO according to another embodiment of the present invention.

FIG. 2 is a schematic representation of a programmable varactor apparatus 200 of a VCO according to another embodiment of the present invention.

The programmable varactor apparatus 200 may include a fixed varactor 202 that may remain enabled. The programmable varactor apparatus 200 may include additional branches of binary weighted varactors 204, 206, 208 controlled by varactor bits. FIG. 2 depicts three branches of binary weighted varactors 204, 206, 208 controlled by three bits. In an alternative embodiment, a programmable varactor apparatus may include a different number of additional branches of binary weighted varactors and an additional number of bits. For example, a programmable varactor apparatus may include two, four, or any other appropriate number of additional branches of binary weighted varactors, and bits.

The programmable varactor apparatus 200 may be connected to a tank circuit 201 through an AC coupling. Thus, the programmable varactor apparatus 200 may be connected to the tank circuit through coupling capacitors.

The programmable varactor apparatus 200 may include control lines 212, 214, 216. The control lines 212, 214, 216 may, with the three bits, control whether one (or more) of the binary weighted varactors 204, 206, 208 is enabled or disabled. If one of the binary weighted varactors 204, 206, 208 is to be enabled, its control line 212, 214, 216 may be connected to the common mode voltage ($V_{CM}$). If one of the binary weighted varactors 204, 206, 208 is to be disabled, its control line 212, 214, 216 may be connected to ground. $V_{CM}$ may represent common mode voltage which may be a DC voltage generated by bias circuitry. Vtune-$V_{CM}$ may be the varactor control voltage V. The bias resistors may send DC voltage Vtune to the varactors while providing the varactors an isolation from Vtune for a high frequency signal, i.e., signal at VCO oscillation frequency.

Figure 3A:
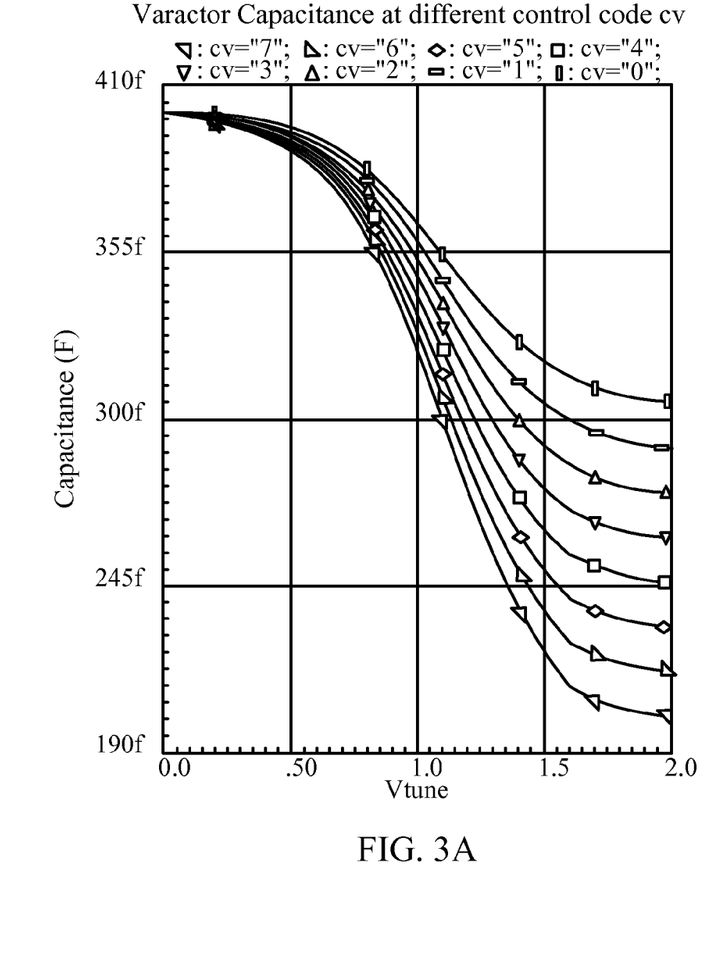
FIG. 3a is a graph of varactor capacitance over Vtune voltage in a circuit including a programmable varactor apparatus according to an embodiment of the present invention.
Figure 3B:
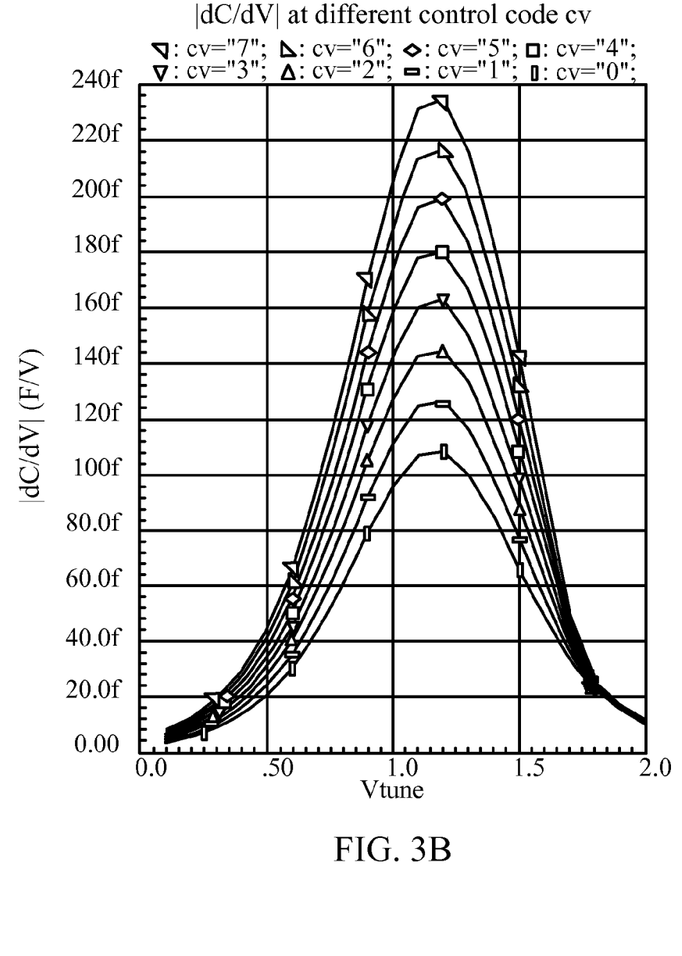
FIG. 3b is a graph of varactor sensitivity over Vtune voltage in a circuit including a programmable varactor apparatus according to an embodiment of the present invention.

FIG. 3a is a graph of varactor capacitance over Vtune voltage in a circuit including a programmable varactor apparatus, such as the programmable varactor apparatus 100 of FIG. 1, according to an embodiment of the present invention. FIG. 3b is graph of varactor sensitivity over Vtune voltage in a circuit including a programmable varactor apparatus according to an embodiment of the present invention. In both FIGS. 3a and 3b, there are eight curves, each of which may represent one of the states in the three bit control. As can be seen in FIG. 3a, capacitance varies depending on the control signal (cv) and Vtune voltage. As can be seen in FIG. 3b, sensitivity varies depending on the control signal and Vtune voltage. When the control signal is zero (cv=0), the varactor sensitivity may be minimal. When the control signal is seven (cv=7), the varactor sensitivity may be the highest.

Figure 4:
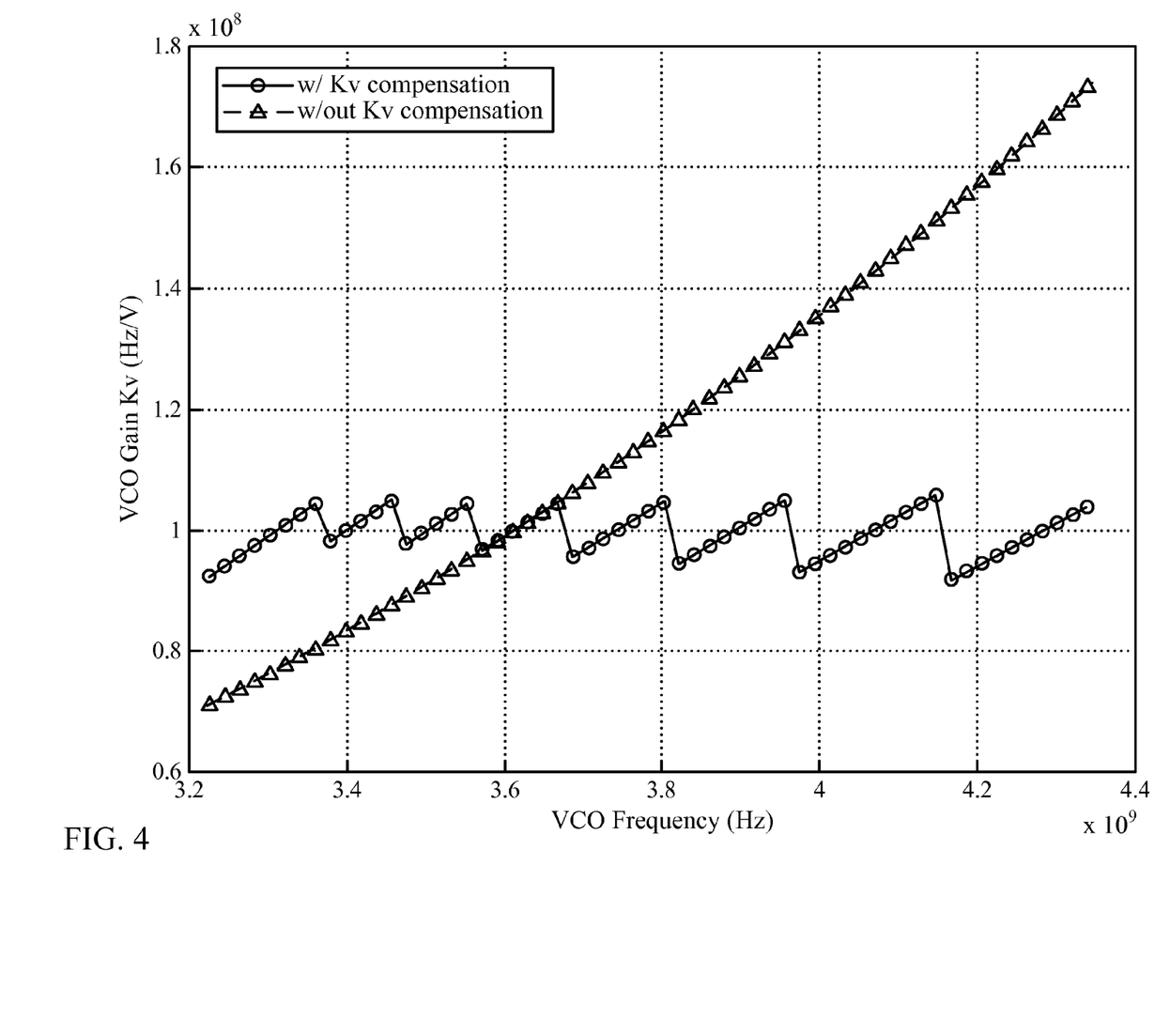
FIG. 4 is a graph of simulated VCO gain variation with compensation from a programmable varactor apparatus according to an embodiment of the present invention and of simulated VCO gain variation without compensation.

FIG. 4 is a graph of simulated VCO gain variation with compensation from a programmable varactor apparatus according to an embodiment of the present invention and of simulated VCO gain variation without compensation. With compensation, VCO gain variation is relatively minimal over the VCO frequency range. As a non-limiting example, VCO gain variation may be ±10% when, for example, 3 bits are used. If more control bits are used, the variation may be smaller. Conversely, without compensation, VCO gain variation is relatively significant over the VCO frequency range. For example, the maximum to minimum VCO gain ratio may be 2.4:1 where the frequency range is 3.2 GHz to 4.4 GHz. This is just an example. If the frequency range is wider, for example, the VCO gain variation may be larger.

Figure 5A:
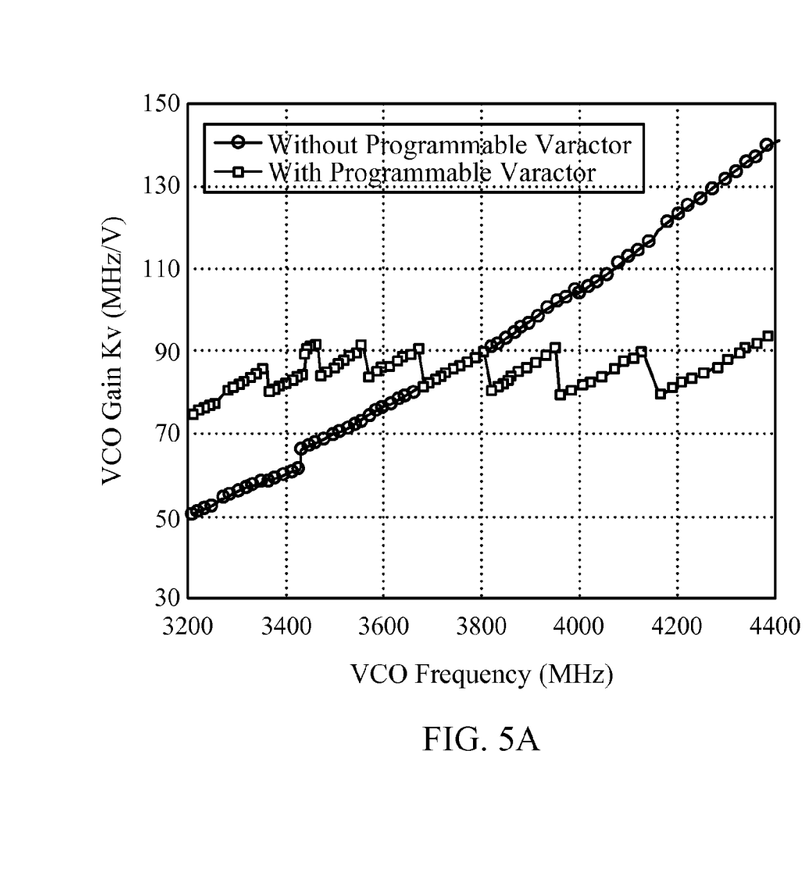
FIG. 5a is a graph of measured VCO gain variation with compensation from a programmable varactor apparatus according to an embodiment of the present invention and of measured VCO gain variation without compensation.

FIG. 5a is a graph of measured VCO gain variation with compensation from a programmable varactor apparatus according to an embodiment of the present invention and of measured VCO gain variation without compensation. As in FIG. 4, with compensation, VCO gain variation is relatively minimal (as a non-limiting example, ±12%) over the VCO frequency range. Conversely, without compensation, VCO gain variation is relatively significant over the VCO frequency range. For example, the maximum to minimum VCO gain ratio may be 2.7:1.

Figure 5B:
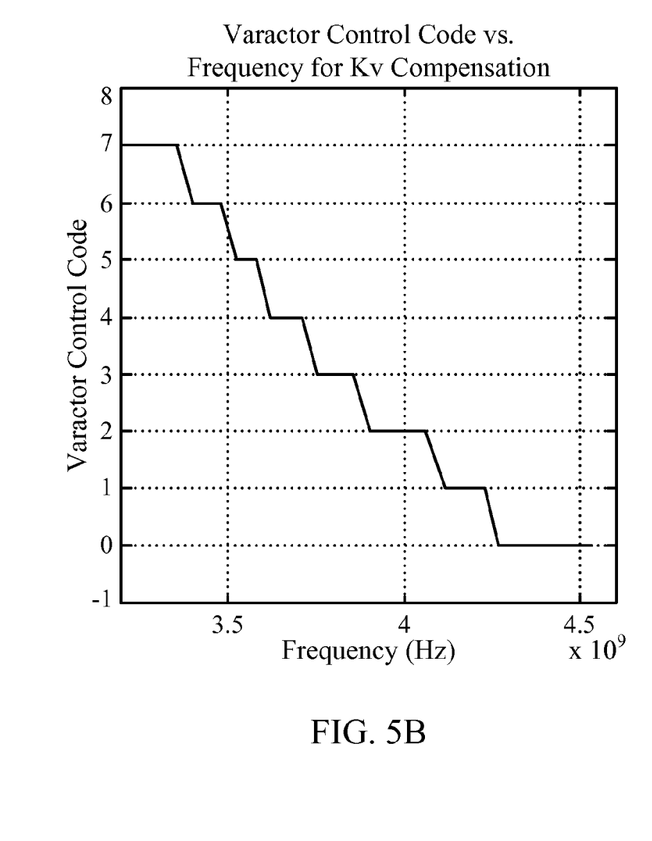
FIG. 5b is a graph of varactor control codes, such as the control codes of FIGS. 3a and 3b, over frequency.

FIG. 5b is a graph of varactor control codes, such as the control codes of FIGS. 3a and 3b, over frequency. The varactor control codes in FIG. 5b may correspond to VCO gain over frequency as shown in FIG. 5a.

Coarse Tune Scheme

VCOs typically may be coarse tuned through a coarse tune frequency operation. With a programmable varactor apparatus, VCO gain may be compensated. Compensated $K_V$ may be relatively constant over frequency and coarse tune codes. However, the coarse tune frequency step $\Delta f$ may still be proportional to $f^3$:

$$\Delta f = f(C + \Delta C) - f(C) \cong \frac{1}{2}\frac{\Delta C}{C}\frac{1}{2\pi\sqrt{LC}} \text{ for } \Delta f << f$$

$\Delta C_i = \Delta C_j$, i.e., same capacitor step for all coarse tune codes $$\Rightarrow \frac{\Delta f_i}{f_i}C_i = \frac{\Delta f_j}{f_j}C_j, \frac{\Delta f_i}{f_i^3} = \frac{\Delta f_j}{f_j^3}$$

where $C_i$ and $C_j$ are the coarse tune capacitor bank capacitance for coarse tune codes i and j, respectively, $\Delta C_i$ and $\Delta C_j$ are the capacitance change when coarse tune code changes from i to i+1 and j to j+1, respectively, and $\Delta f_i$ and $\Delta f_j$ are the corresponding VCO oscillation frequency change.

A coarse tune frequency operation that may be substantially constant may be desirable. In order to maintain the same number of coarse tune curves covering each frequency channel for compensated VCO gain, $\Delta f$ constant and $\Delta C$ proportional to $1/f^3$ may be needed. This may be achieved by adding 1~2 extra physical control bits to a coarse tune capacitor bank while still using the same number of logical control bits. With a nonlinear mapping from the logical bits to the physical bits, the logical $\Delta C$ may become approximately proportional to $1/f^3$ and $\Delta f$ relatively constant. Thus, evenly spaced coarse tune steps may be implemented through logical to physical coarse tune code mapping to achieve desirable coarse tune coverage. While 1~2 bits may be sufficient, additional bits may be added. The more bits added, the closer Δf may become to constant.

Figure 6A:
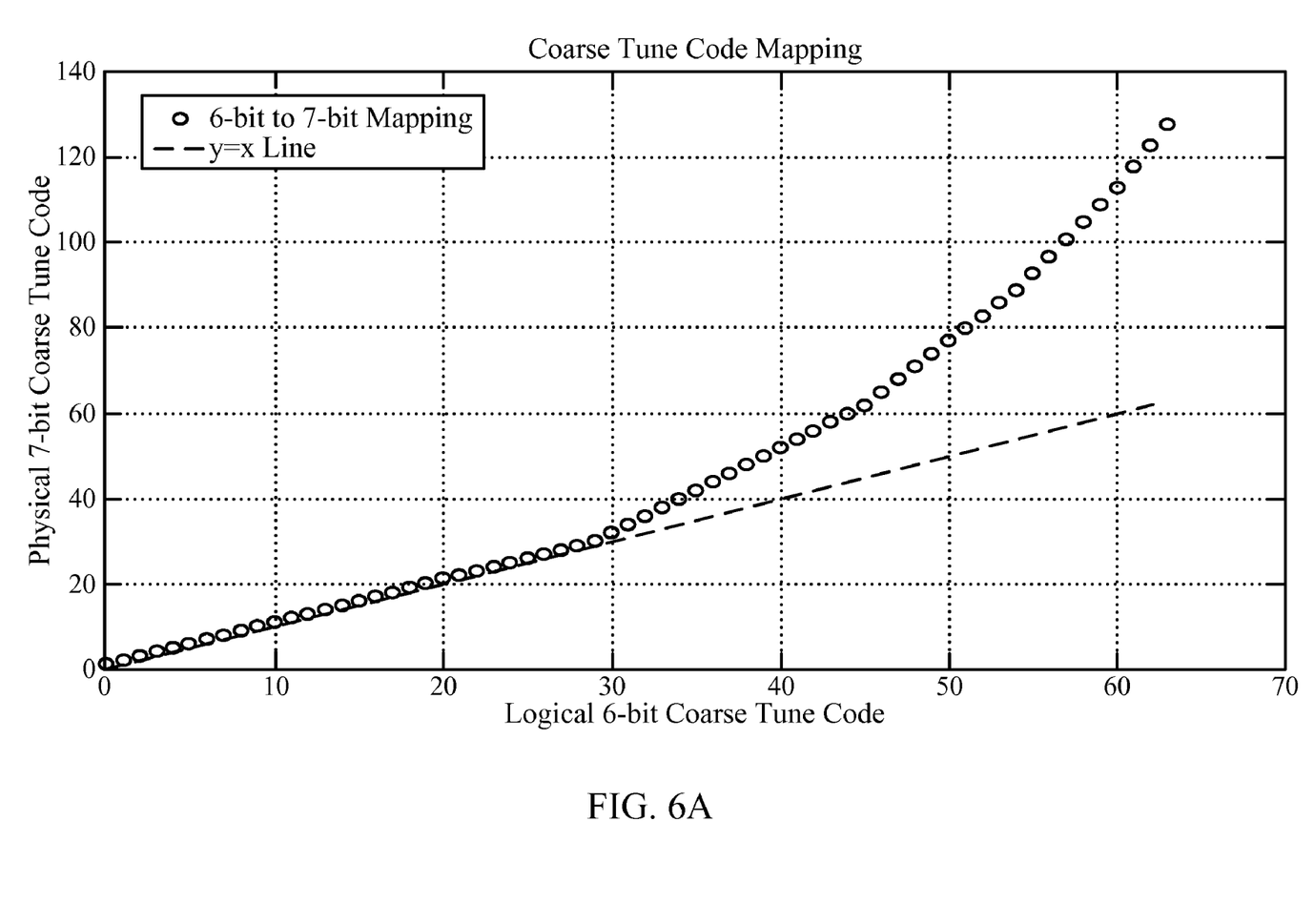
FIG. 6a is a graph of physical 7-bit coarse tune code over logical 6-bit coarse tune code in 6 to 7 bit coarse tune code mapping according to an embodiment of the present invention.
Figure 6B:
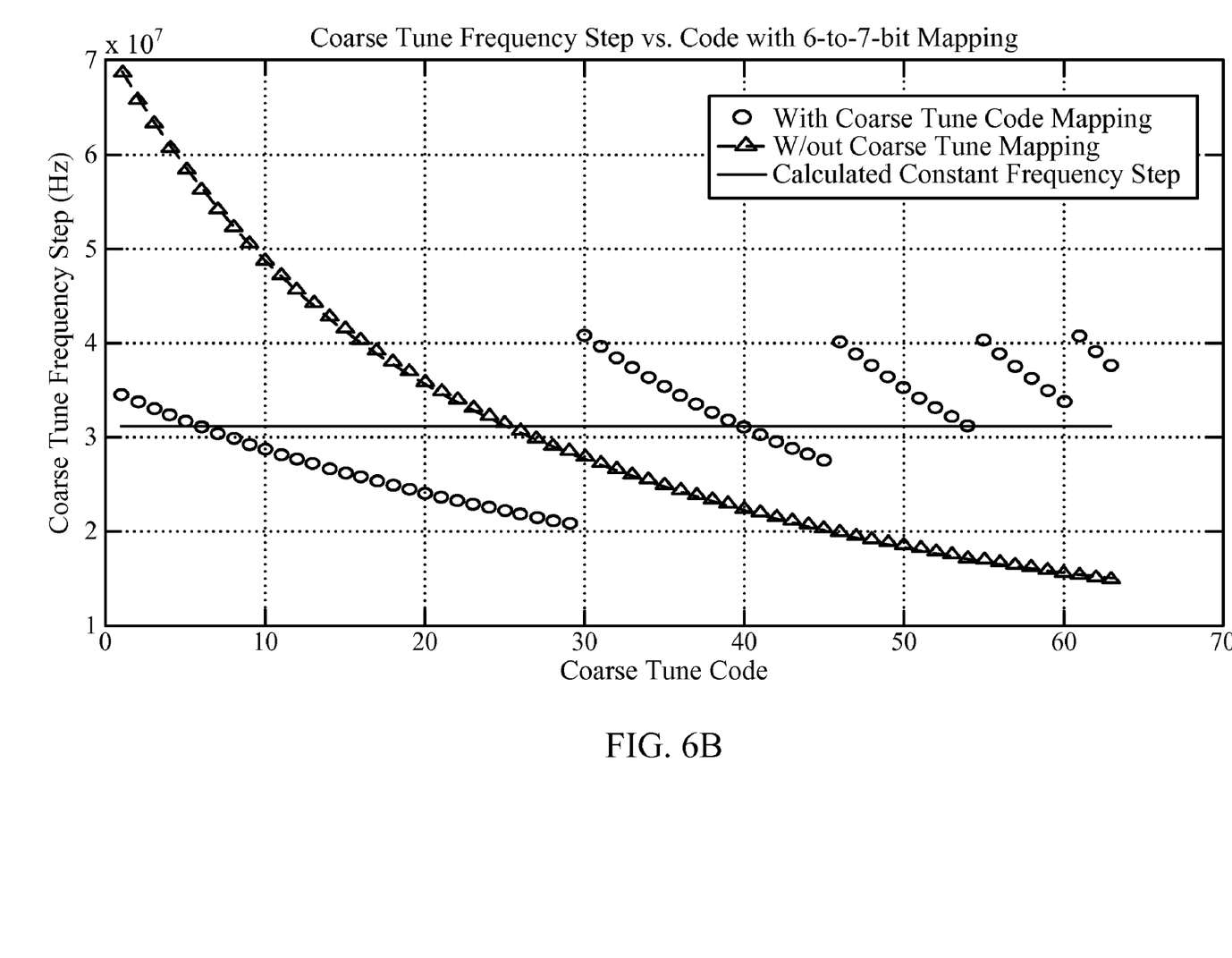
FIG. 6b is a graph of coarse tune frequency step over coarse tune code with and without 6 to 7 bit coarse tune code mapping.

FIG. 6a is a graph of physical 7-bit coarse tune code over logical 6-bit coarse tune code in 6 to 7 bit coarse tune code mapping according to an embodiment of the present invention. FIG. 6b is a graph of coarse tune frequency step over coarse tune code with and without 6 to 7 bit coarse tune code mapping. With coarse tune code mapping, the coarse tune frequency step variation is significantly less than without coarse tune code mapping. As a non-limiting example, the coarse tune frequency step variation with 6 to 7 bit coarse tune code mapping may be ±30%, whereas the maximum to minimum coarse tune step ratio may be 4.6:1 without coarse tune code mapping.

Figure 7A:
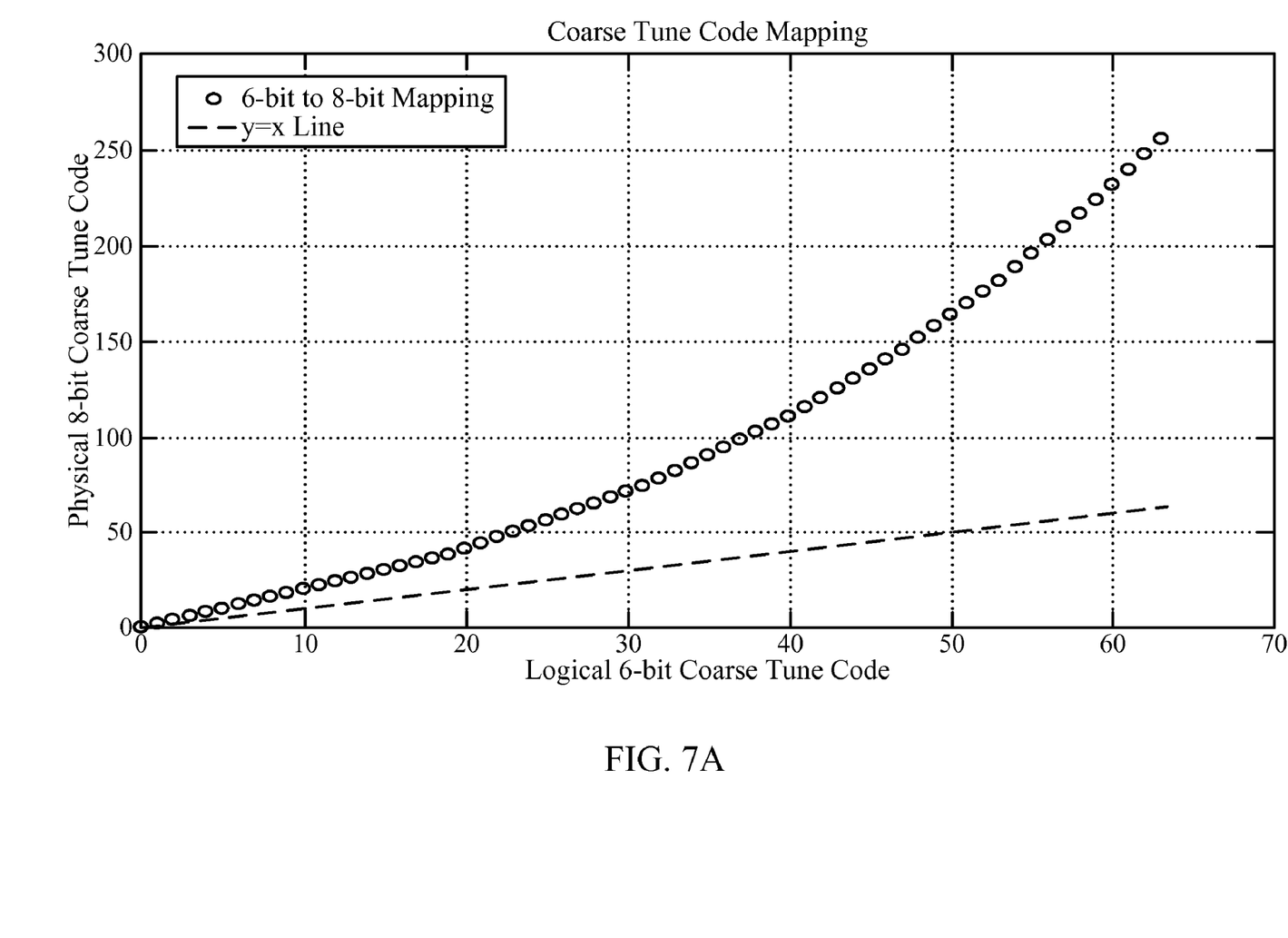
FIG. 7a is a graph of physical 8-bit coarse tune code over logical 6-bit coarse tune code in 6 to 8 bit coarse tune code mapping according to an embodiment of the present invention.
Figure 7B:
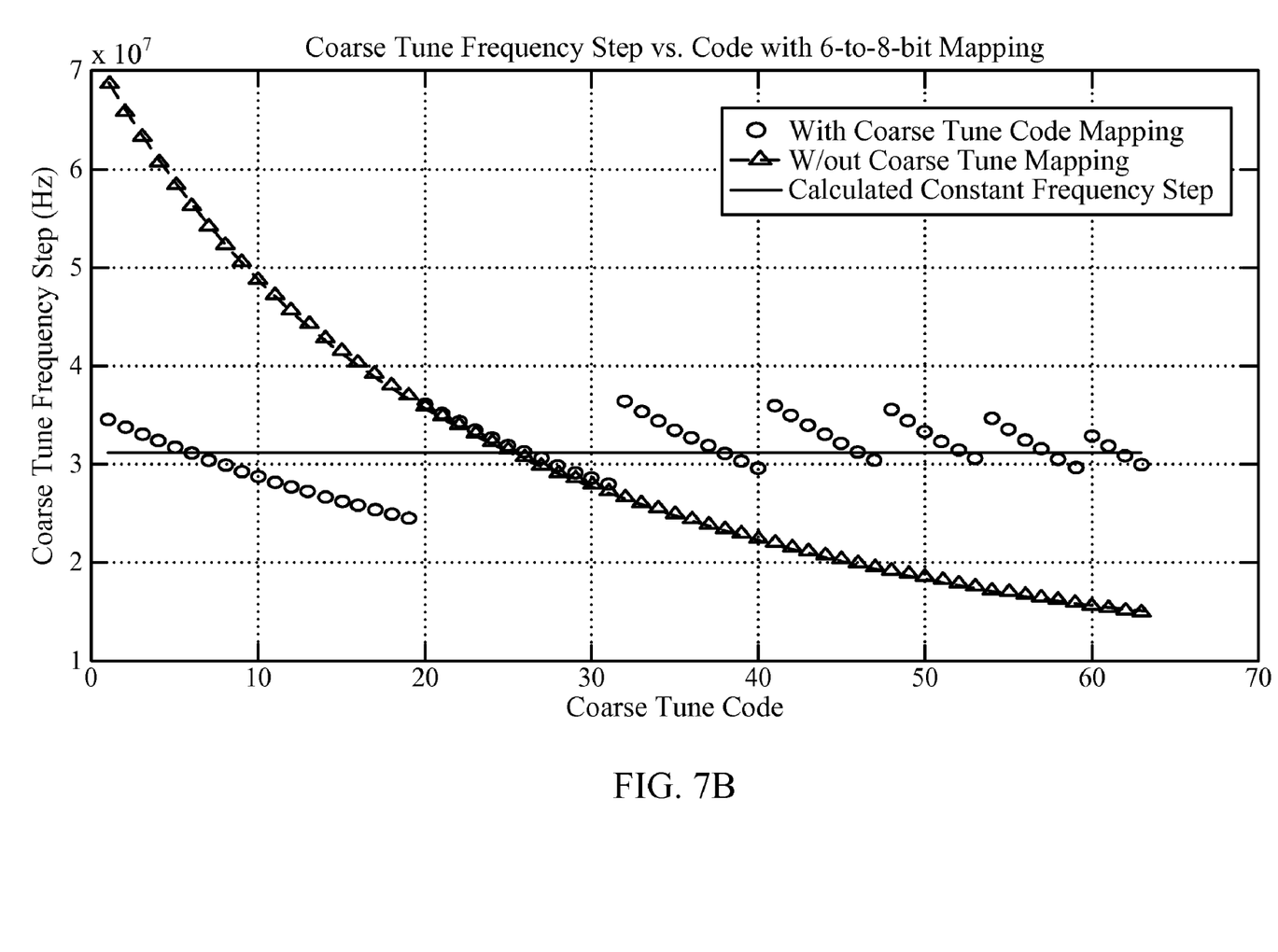
FIG. 7b is a graph of a coarse tune frequency step over coarse tune code with and without 6 to 8 bit coarse tune code mapping.

FIG. 7a is a graph of physical 8-bit coarse tune code over logical 6-bit coarse tune code in 6 to 8 bit coarse tune code mapping according to an embodiment of the present invention. FIG. 7b is a graph of a coarse tune frequency step over coarse tune code with and without 6 to 8 bit coarse tune code mapping. With 6 to 8 bit coarse tune code mapping, the coarse tune frequency step variation is even smaller than with 6 to 7 bit coarse tune code mapping as shown in FIG. 6a. As a non-limiting example, the coarse tune frequency step variation with 6 to 8 bit coarse tune code mapping may be ±17%.

Figure 8A:
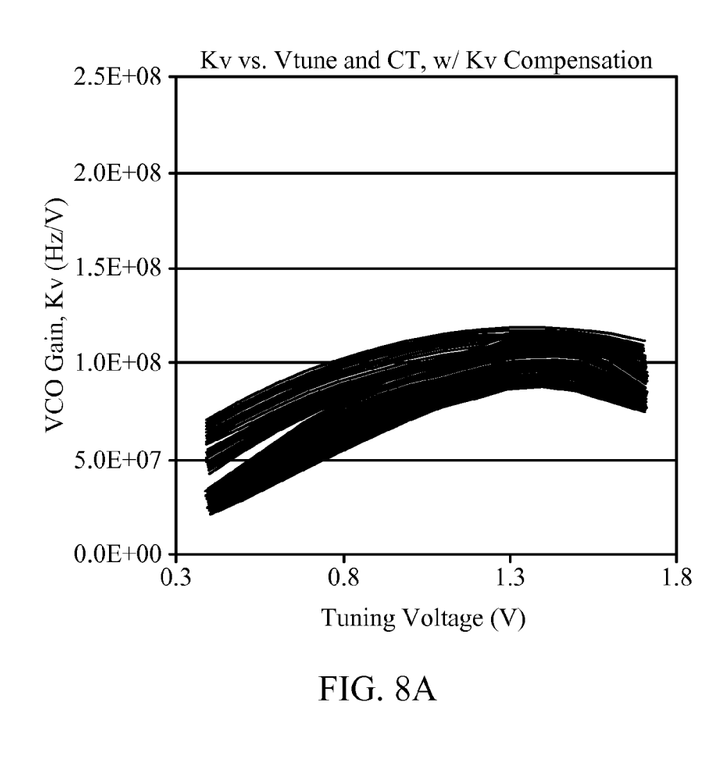
FIG. 8a is a graph of VCO gain over tuning voltage in a circuit including a programmable varactor apparatus according to an embodiment of the present invention.
Figure 8B:
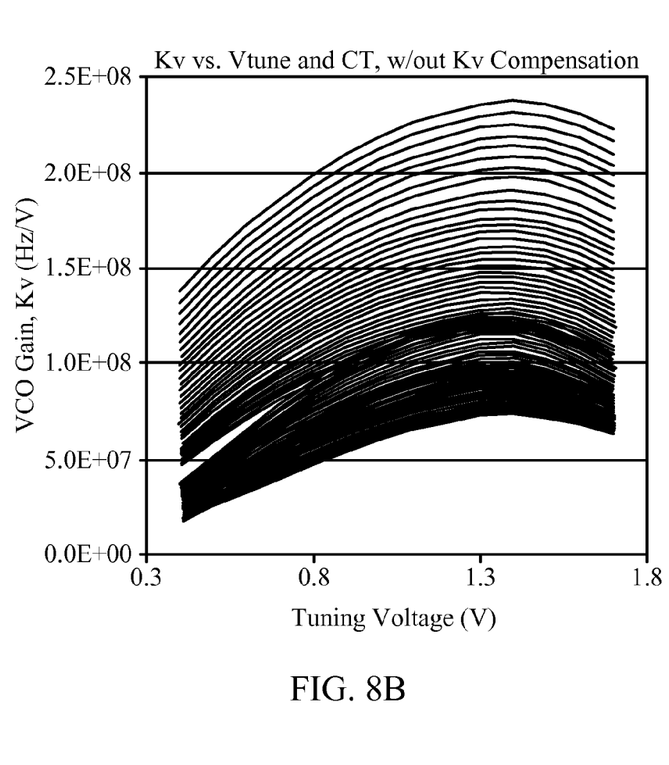
FIG. 8b is a graph of VCO gain over tuning voltage in a circuit not using a programmable varactor apparatus.

FIG. 8a is a graph of VCO gain over tuning voltage in a circuit including a programmable varactor apparatus according to an embodiment of the present invention. FIG. 8b is a graph of VCO gain over tuning voltage in a circuit not using a programmable varactor apparatus. As shown in FIGS. 8a and 8b, there is less VCO gain variation in a circuit including a programmable varactor apparatus than in a circuit not using a programmable varactor apparatus.

Figure 9:
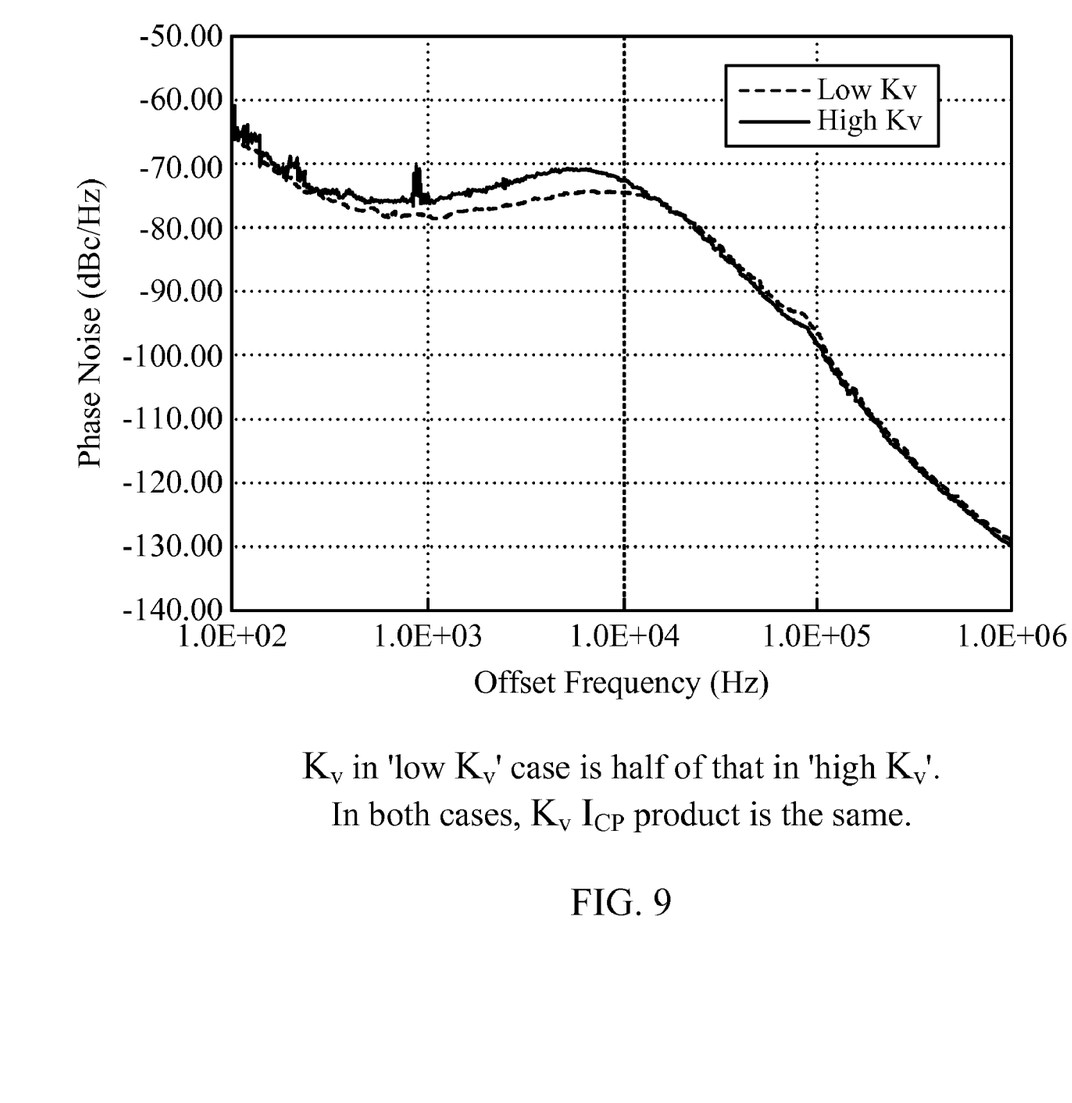
FIG. 9 is a graph of closed loop synthesizer phase noise over offset frequency.

FIG. 9 is a graph of closed loop synthesizer phase noise. The solid line represents high VCO gain compensated with lower charge pump current. The dashed line represents lower VCO gain. The VCO gain in the low $K_V$ case may, as an example, be half of that in the high $K_V$ case. In both cases, the product of the VCO gain and charge pump current may be the same. Thus, PLL loop dynamics may be the same in both cases. However, the phase noise result with the lower VCO gain is better than the phase noise result with the high VCO gain compensated with lower charge pump current. In an exemplary embodiment, the integrated phase noise from 1 kHz to 100 kHz in the high $K_V$ case may be −29.4 dB and in the low $K_V$ case may be −31.3 dB. Thus, the low $K_V$ case may have an improvement of 1.9 dB.

Figure 10:
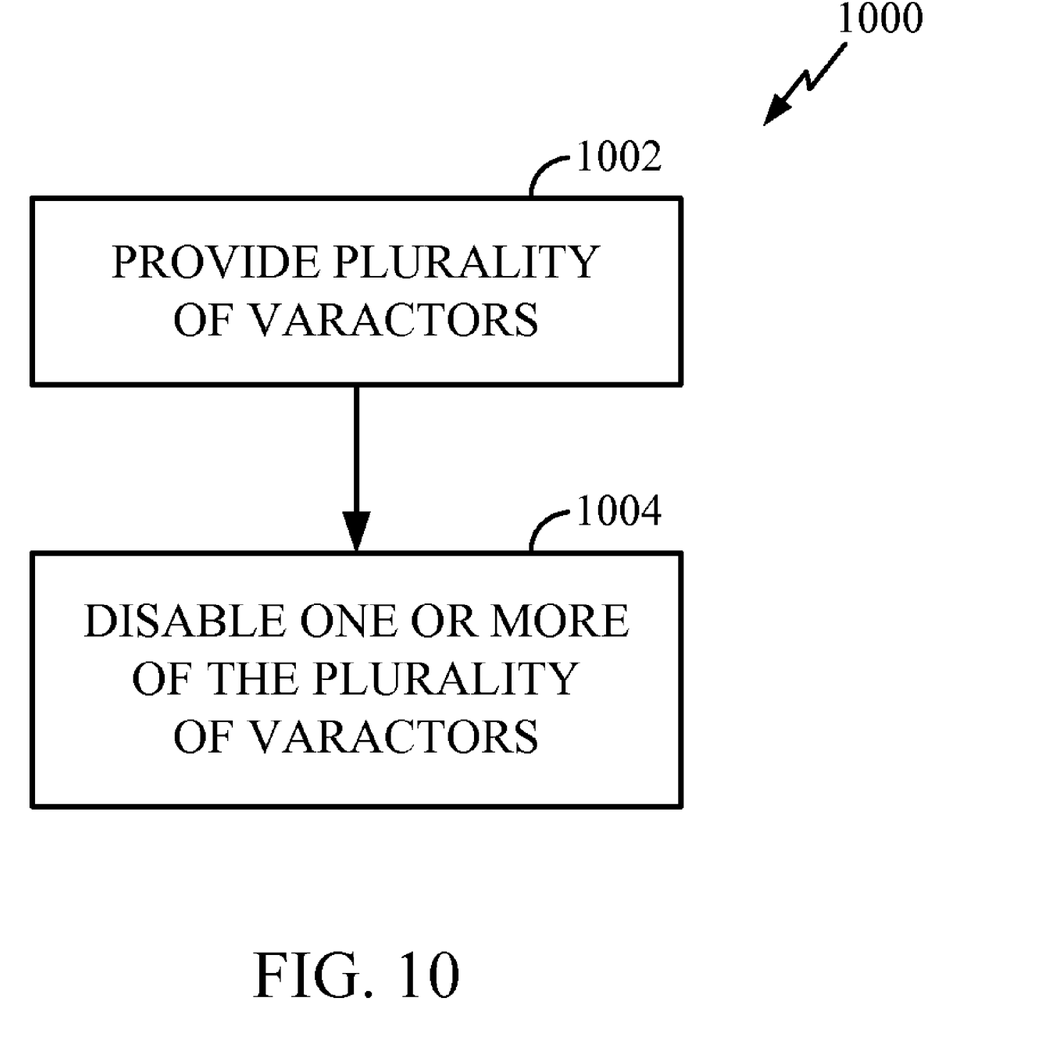
FIG. 10 is a flow chart of a method for changing an effective capacitance of a programmable varactor apparatus according to an embodiment of the present invention.

FIG. 10 is a flow chart of a method 1000 for changing an effective capacitance of a programmable varactor apparatus, such as the programmable varactor apparatus 100 of FIG. 1, according to an embodiment of the present invention. The method 1000 may include a step 1002 of providing a plurality of binary weighted varactors, such as the varactors 104, 106, 108 of FIG. 1; and a step 1004 of disabling one or more of the plurality of binary weighted varactors to decrease the effective capacitance of the programmable varactor apparatus. The disabling step 1004 may include disabling one or more of the plurality of binary weighted varactors based on a counter value proportional to a VCO frequency. The method 1000 may further include a step of coarse tune mapping. Coarse tune mapping may be the logical to physical coarse tune code mapping for $C_{CT}$. $C_{CT}$, shown in FIGS. 1 and 2 as a lumped capacitor, may be multiple binary capacitors controlled by coarse tune codes, such as the 7 or 8 bits in FIGS. 6 and 7.

It should be understood, of course, that the foregoing relates to exemplary embodiments of the invention and that modifications may be made without departing from the spirit and scope of the invention as set forth in the following claims.

I claim:

1. A programmable varactor apparatus, comprising:
a plurality of binary weighted varactors; and
a control to selectively disable one or more of the plurality of binary weighted varactors based on a counter value proportional to a target oscillator frequency to decrease an effective capacitance of the programmable varactor apparatus.

2. The programmable varactor apparatus of claim 1, wherein the control comprises a plurality of control lines, each corresponding to one of the plurality of weighted varactors.

3. The programmable varactor apparatus of claim 1, wherein the control comprises varactor control bits.

4. The programmable varactor apparatus of claim 1, further comprising binary weighted control bits to adjust the programmable varactor apparatus.

5. A programmable varactor apparatus, comprising:
a plurality of binary weighted varactors;
a control to selectively disable one or more of the plurality of binary weighted varactors to decrease an effective capacitance of the programmable varactor apparatus; and
a coarse tune capacitor bank comprising physical control bits numbering at least one more in quantity than logical control bits.

6. The programmable varactor apparatus of claim 5, wherein the coarse tune capacitor bank comprises 7 physical control bits.

7. The programmable varactor apparatus of claim 5, wherein the coarse tune capacitor bank comprises 8 physical control bits.

8. A programmable varactor apparatus, comprising:
a plurality of binary weighted varactors;
a plurality of bits to control the plurality of binary weighted varactors by selectively disabling one or more of the plurality of binary weighted varactors based on a counter value proportional to a target oscillator frequency to decrease an effective capacitance of the programmable varactor apparatus.

9. A voltage controlled oscillator, comprising:
a signal output to output a signal at a frequency;
an input tuning voltage to affect the frequency of the signal;
a gain; and
a programmable varactor apparatus comprising:
a plurality of binary weighted varactors; and
a plurality of control lines, each corresponding to one of the plurality of binary weighted varactors, to selectively disable one or more of the plurality of the binary weighted varactors to maintain a substantially constant value of the gain regardless of a value of the frequency,
wherein one or more of the plurality of control lines selectively disables one or more of the plurality of binary weighted varactors based on a counter value proportional to the frequency.

10. The voltage controlled oscillator of claim 9, further comprising a control comprising varactor bits to control the plurality of control lines.

11. The voltage controlled oscillator of claim 9, further comprising binary weighted control bits to adjust the programmable varactor apparatus.

12. The voltage controlled oscillator of claim 9, further comprising a coarse tune capacitor bank comprising physical control bits numbering at least one more in quantity than logical control bits.

13. A programmable varactor apparatus, comprising:
   a fixed enabled varactor;
   a plurality of binary weighted varactors;
   a plurality of control lines, each corresponding to one of the plurality of binary weighted varactors, to selectively disable one or more of the plurality of the binary weighted varactors to decrease an effective capacitance of the programmable varactor apparatus; and
   varactor bits to control the plurality of control lines based on a counter value proportional to a target oscillator frequency.

14. The programmable varactor apparatus of claim 13, wherein the programmable varactor apparatus is directly connected to a tank circuit in a DC coupling.

15. The programmable varactor apparatus of claim 13, wherein the programmable varactor apparatus is connected to a tank circuit through one or more coupling capacitors in an AC coupling.

16. The programmable varactor apparatus of claim 13, wherein the plurality of binary weighted varactors comprises three binary weighted varactors.

17. The programmable varactor apparatus of claim 13, wherein the plurality of control lines comprises three control lines.

18. The programmable varactor apparatus of claim 13, further comprising binary weighted control bits to adjust the programmable varactor apparatus.

19. The programmable varactor apparatus of claim 13, further comprising a coarse tune capacitor bank comprising physical control bits numbering at least one more in quantity than logical control bits.

20. A programmable varactor apparatus, comprising:
   means for providing a plurality of varactors; and
   means for controlling the plurality of varactors to change an effective capacitance of the programmable varactor apparatus based on a counter value proportional to a target oscillator frequency.

21. A programmable varactor apparatus, comprising:
   means for providing a plurality of varactors;
   means for controlling the plurality of varactors to change an effective capacitance of the programmable varactor apparatus; and
   means for coarse tune mapping a coarse tune capacitor bank.

22. A method for changing an effective capacitance of a programmable varactor apparatus, the method comprising:
   providing a plurality of binary weighted varactors; and
   disabling one or more of the plurality of binary weighted varactors based on a counter value proportional to a target oscillator frequency to decrease the effective capacitance of the programmable varactor apparatus.

23. A method for changing an effective capacitance of a programmable varactor apparatus, comprising:
   providing a plurality of binary weighted varactors;
   disabling one or more of the plurality of binary weighted varactors to decrease the effective capacitance of the programmable varactor apparatus; and
   coarse tune mapping a coarse tune capacitor bank.

24. A method for changing an effective capacitance of a programmable varactor apparatus, the method comprising:
   a step for providing a plurality of binary weighted varactors; and
   a step for disabling one or more of the plurality of binary weighted varactors based on a counter value proportional to a target oscillator frequency to decrease the effective capacitance of the programmable varactor apparatus.

25. A method for changing an effective capacitance of a programmable varactor apparatus, comprising:
   a step for providing a plurality of binary weighted varactors;
   a step for disabling one or more of the plurality of binary weighted varactors to decrease the effective capacitance of the programmable varactor apparatus; and
   a step for coarse tune mapping a coarse tune capacitor bank.

* * * * *